United States Patent
Yano et al.

(10) Patent No.: US 8,405,756 B2
(45) Date of Patent: Mar. 26, 2013

(54) OPTICAL ELEMENT, OPTICAL ELEMENT WAFER, OPTICAL ELEMENT WAFER MODULE, OPTICAL ELEMENT MODULE, METHOD FOR MANUFACTURING OPTICAL ELEMENT MODULE, ELECTRONIC ELEMENT WAFER MODULE, METHOD FOR MANUFACTURING ELECTRONIC ELEMENT MODULE, ELECTRONIC ELEMENT MODULE AND ELECTRONIC INFORMATION DEVICE

(75) Inventors: Yuji Yano, Osaka (JP); Norimichi Shigemitsu, Osaka (JP); Kengo Iwai, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 666 days.

(21) Appl. No.: 12/565,444

(22) Filed: Sep. 23, 2009

(65) Prior Publication Data

US 2010/0073531 A1  Mar. 25, 2010

(30) Foreign Application Priority Data

Sep. 25, 2008  (JP) ................................. 2008-246971
Aug. 28, 2009  (JP) ................................. 2009-199024

(51) Int. Cl.
*H04N 5/225* (2006.01)

(52) U.S. Cl. .......................... 348/340; 348/335; 348/374

(58) Field of Classification Search ................. 348/294, 348/334, 340, 373, 374; 257/432–434; 359/619, 359/637, 754, 797, 811, 819, 823, 824, 830; 396/55, 133, 144, 529, 535

See application file for complete search history.

(56) References Cited

U.S. PATENT DOCUMENTS

| | | | | |
|---|---|---|---|---|
| 6,072,634 | A | * | 6/2000 | Broome et al. ............... 359/637 |
| 2004/0169763 | A1 | * | 9/2004 | Ikeda ............................ 348/340 |
| 2004/0212719 | A1 | * | 10/2004 | Ikeda ............................ 348/340 |
| 2005/0104991 | A1 | * | 5/2005 | Hoshino et al. ............... 348/340 |
| 2006/0044450 | A1 | * | 3/2006 | Wolterink et al. ............ 348/340 |
| 2006/0221469 | A1 | * | 10/2006 | Ye ................................. 359/811 |

FOREIGN PATENT DOCUMENTS

JP  2004-063751  2/2004

\* cited by examiner

*Primary Examiner* — Nelson D. Hernández Hernández
(74) *Attorney, Agent, or Firm* — Edwards Wildman Palmer LLP; David G. Conlin; David A. Tucker

(57) ABSTRACT

An optical element according to the present invention includes: an optical surface at a center portion thereof; a spacer section having a predetermined thickness on an outer circumference side of the optical surface; a support plate including one or a plurality of through holes penetrating a portion corresponding to the optical surface, provided inside a transparent resin material, wherein the support plate has light shielding characteristics, an outer circumference portion side of the through hole of the support plate is provided inside the spacer section, and the outer circumference portion side of the through hole is configured to be thicker than a further outer circumference portion side thereof.

57 Claims, 10 Drawing Sheets

(a)

(b)

OPTICAL ELEMENT, OPTICAL ELEMENT WAFER, OPTICAL ELEMENT WAFER MODULE, OPTICAL ELEMENT MODULE, METHOD FOR MANUFACTURING OPTICAL ELEMENT MODULE, ELECTRONIC ELEMENT WAFER MODULE, METHOD FOR MANUFACTURING ELECTRONIC ELEMENT MODULE, ELECTRONIC ELEMENT MODULE AND ELECTRONIC INFORMATION DEVICE

This nonprovisional application claims priority under 35 U.S.C. §119(a) to Patent Applications No. 2008-246971 filed in Japan on Sep. 25, 2008, and No. 2009-199024 filed in Japan on Aug. 28, 2009, the entire contents of which are hereby incorporated by reference.

BACKGROUND OF THE INVENTION

1. Field of the Invention

The present invention is related to an optical element provided with a lens and an optical function element. Further, the present invention is related to an optical element wafer provided with a plurality of optical elements, such as a plurality of lenses and a plurality of optical function elements, in a wafer state. Further, the present invention is related to an optical element wafer module in which the plurality of optical element wafers are laminated. Further, the present invention is related to an optical element module, which is made by cutting the optical element wafer or the optical element wafer module, and a method for manufacturing the optical element module. Further, the present invention is related to an electronic element wafer module in which the optical element wafer or optical element wafer module is modularized with an electronic element wafer. Further, the present invention is related to a method for manufacturing an electronic element module, in which the electronic element wafer module is cut simultaneously into electronic element modules or in which the optical element or optical element module is modularized with an electronic element. Further, the present invention is related to an electronic element module manufactured by the method for manufacturing the electronic element module. Further, the present invention is related to an electronic information device, such as a digital camera (e.g., a digital video camera or a digital still camera), an image input camera, a scanner, a facsimile machine, a camera-equipped cell phone device and a television telephone device, including the electronic element module used therein.

2. Description of the Related Art

Further downsizing and lowering the cost are requested for a camera-equipped cell phone device and a personal digital assistant (PDA) and so on as conventional optical devices that include an image capturing element and a light-focusing lens element thereabove.

In response to such a request, Reference 1 proposes a method for obtaining an image capturing element module, the method including the steps of: forming and connecting an image capturing element for performing a photoelectric conversion on and capturing an image of incident light and a lens element thereabove for focusing light at a wafer level; modularizing the image capturing element and the lens element as an image capturing element wafer module, which functions as an electronic element wafer module; and individualizing the modularized image capturing element wafer module by simultaneous cutting. According to the method, a transparent substrate is adhered above a semiconductor wafer having an image capturing element at the center portion, with a spacer interposed therebetween. A convex lens is formed as a light-focusing lens element on the transparent substrate in a closely-adhered manner.

Furthermore, Reference 1 discloses an example where a lens is formed in each of a plurality of through holes of a lens substrate. It is conceived that a plurality of such lens wafer modules are laminated on an image capturing element wafer to be modularized. FIG. 9 illustrates this module.

FIG. 9 illustrates a lens wafer disclosed in Reference 1, and is an essential part longitudinal cross sectional view illustrating an image capturing wafer module, in which a plurality of lens wafers are used with lenses provided in a plurality of through holes of a lens substrate and the lens wafers are modularized with an image capturing element wafer.

In FIG. 9, an image capturing element wafer module 250 includes: an image capturing element wafer 252, in which a plurality of image capturing elements 251 are arranged in a matrix, the image capturing elements 251 including a plurality of light receiving sections for performing a photoelectric conversion on and capturing an image of image light from a subject; and a transparent support substrate 254 with a resin adhesion layer 253 interposed therebetween, part of which is removed above the image capturing element 251. A lens wafer module 255 is provided being adhered on the transparent support substrate 254, the lens wafer module 255 being provided such that each lens position corresponds to each of the plurality of image capturing elements 251. The lens wafer module 255 is provided with a lens substrate 256 in such a manner to fill an outer circumference area of a lens, and a lens wafer 255a is configured to be adhered on a lens wafer 255b by an adhesive 257 herein. In addition, on a front surface side of the lens wafer 255a, a light shielding plate 258 with an opening (hole) on an optical surface A is provided being adhered by the adhesive 257. Further, the transparent support substrate 254 is adhered with the lens wafer 255b by the adhesive 257. The adhesive 257 is provided in an area having a predetermined width on an outer circumference side of the openings of the light shielding plate and the lens substrate 256 as well as along each side inside of square or rectangular dicing lines DL on the outer circumference side of the circular optical surface A, which is at the center, when viewing the image capturing element wafer module 250 of FIG. 10, as illustrated in FIG. 9.

The image capturing element wafer module 250 is illustrated in FIG. 9 with a unitary module cross-sectional structure; however, a large number of the unitary module cross-sectional structures are arranged in a matrix of row and column directions. The unitary module cross-sectional structure is an image capturing element module after the individualizing along the dicing lines DL.

Reference 1: Japanese Laid-Open Publication No. 2005-539276

SUMMARY OF THE INVENTION

In the conventional structure of Reference 1, in order to shield light from above for the image capturing element 251, the light shielding plate 258 with an opening (window) above the optical surface A is provided by the adhesion of the adhesive 257 on the front surface side of the first lens wafers 255a and 255b. Further, although the lens support plate 256 shields light in the transverse direction for the image capturing element 251, light still enters due to the adhesive 257 and the film thickness of the transparent lens resin, which means the shielding of light from the side is not sufficient.

The present invention is intended to solve the conventional problems described above. The objective of the present invention is to provide, after the manufacturing of a module: an optical element wafer capable of further shielding light in the transverse direction; an optical element individualized from the optical element wafer; an optical element wafer module in which the plurality of optical element wafers are laminated; an optical element module individualized from the optical element wafer module; a method for manufacturing the optical element module in which the optical element module is manufactured by cutting the optical element wafer or optical element wafer module; an electronic element wafer module in which the optical element wafer or optical element wafer module is modularized with an electronic element wafer; a method for manufacturing an electronic element module in which the electronic element wafer module is simultaneously cut into pieces or in which the optical element or optical element module is modularized with an electronic element, to manufacture the electronic element module; an electronic element module manufactured by the method for manufacturing the electronic element module; and an electronic information device, such as a camera-equipped cell phone device, including the electronic element module used as an image input device in an image capturing section thereof.

An optical element according to the present invention includes: an optical surface at a center portion thereof; a spacer section having a predetermined thickness on an outer circumference side of the optical surface; a support plate including one or a plurality of through holes penetrating a portion corresponding to the optical surface, provided inside a transparent resin material, wherein the support plate has light shielding characteristics, an outer circumference portion side of the through hole of the support plate is provided inside the spacer section, and the outer circumference portion side of the through hole is configured to be thicker than a further outer circumference portion side thereof, thereby achieving the objective described above.

Preferably, in an optical element according to the present invention, the outer circumference portion and the further outer circumference portion of the through hole of the support plate are connected to each other with a light-shielding tapered surface for the optical surface interposed therebetween.

Still preferably, in an optical element according to the present invention, an inner circumference surface of the through hole of the support substrate is configured as an inclined surface, and a through hole and/or a concave portion for releasing a resin material when forming resin is further provided at the further outer circumference portion.

Still preferably, in an optical element according to the present invention, a surface height of the spacer section is configured to be higher than a surface height of the optical surface, and the spacer section and the optical surface are connected to each other with an inclined surface interposed therebetween.

Still preferably, in an optical element according to the present invention, the spacer section is provided for the optical surface.

Still preferably, in an optical element according to the present invention, the spacer section is a protruded portion or a planarized portion, which is further protruded than a convex shape of the optical surface, surrounding the optical surface area from the outer circumference portion of the optical surface with the inclined surface interposed therebetween.

Still preferably, in an optical element according to the present invention, the protruded portion is annularly protruded, or is protruded as part of the annular shape, further than the convex shape of the optical surface, from the outer circumference side of the optical surface with the inclined surface interposed therebetween.

Still preferably, in an optical element according to the present invention, when a securing tape is adhered on the spacer section to cover an upper part thereof during individual cutting, the surface height of the spacer section is configured to be higher than the surface height of the optical surface so that the securing tape does not adhere on the optical surface of the optical element.

Still preferably, in an optical element according to the present invention, the optical surface and the protruded portion or the planarized portion, which is more protruded than the optical surface, are provided on either a front surface or a back surface of the optical element.

Still preferably, in an optical element according to the present invention, a part or all of a top surface of the annular protruded portion includes a planarized surface.

Still preferably, in an optical element according to the present invention, a difference between the surface height of the spacer section and the surface height of the optical surface is within 20 μm to 100 μm.

Still preferably, in an optical element according to the present invention, a difference between the surface height of the spacer section and the surface height of the optical surface is 50 μm plus or minus 10 μm.

Still preferably, in an optical element according to the present invention, the optical surface and the spacer section are simultaneously formed with a transparent resin material.

Still preferably, in an optical element according to the present invention, the optical element is a lens.

Still preferably, in an optical element according to the present invention, the optical element is an optical function element for directing output light straight to be output and refracting and guiding incident light in a predetermined direction.

Still preferably, in an optical element according to the present invention, the optical surface is a circle with a diameter of 1 mm plus or minus 0.5 mm.

Still preferably, in an optical element according to the present invention, a bottom portion for positioning an adhesive material is provided on a further outer circumference side of the spacer section with a step portion interposed therebetween.

An optical element module according to the present invention is provided, in which the plurality of optical elements according to the present invention are laminated, wherein of an upper most optical element and a lower most optical element, a height of a surface of a spacer section of at least either optical element is higher than a height of a surface of an optical surface of the optical element, thereby achieving the objective described above.

Preferably, in an optical element module according to the present invention, among the plurality of the optical elements, a lens space between the upper optical element and the lower optical element is controlled by a planarized surface of the spacer section of the upper optical element and a planarized surface of the spacer section of the lower optical element in direct contact with each other.

Still preferably, in an optical element module according to the present invention, an adhesive is positioned in a space portion surrounded by a bottom portion on a further outer circumference side of each of the planarized surfaces of the spacer section of the upper optical element and the spacer section of the lower optical element, so that the upper optical element and the lower optical element are adhered to each other.

Still preferably, in an optical element module according to the present invention, the space portion of the bottom portion is a sufficient space for the adhesive to be put between and be spread by bottom portions of the upper and lower optical elements when adhering.

Still preferably, in an optical element module according to the present invention, the adhesive is provided on an outside of the optical surface and an inside of a quadrilateral along dicing lines at a predetermined width, and a vent is provided at a corner portion and/or a side portion of the quadrilateral adhesive.

Still preferably, in an optical element module according to the present invention, an adhesive for capturing dust is further provided on an outside of the optical surface and an inside of the quadrilateral along dicing lines at a predetermined width, the adhesive being cohesive even after a curing of the resin.

Still preferably, in an optical element module according to the present invention, a part or all of the adhesive for capturing dust is provided facing the vent inside the quadrilateral adhesive.

Still preferably, in an optical element module according to the present invention, the adhesive has light shielding characteristics.

Still preferably, in an optical element module according to the present invention, of an upper surface, except for the optical surface, and a side surface of the plurality of optical elements, the optical element module further includes, a light shielding holder for shielding at least the upper surface.

Still preferably, in an optical element module according to the present invention, of an upper surface, except for the optical surface, and a side surface of the optical element according to the present invention, the optical element module further includes a light shielding holder for shielding at least the upper surface.

An optical element wafer according to the present invention is provided, in which a plurality of the optical elements according to the present invention are simultaneously formed and arranged in two dimensions, thereby achieving the objective described above.

An optical element wafer module according to the present invention is provided, in which a plurality of optical element wafers according to the present invention are laminated by aligning the optical surfaces thereof, thereby achieving the objective described above.

An optical element wafer module according to the present invention is provided, in which a plurality of optical element modules according to the present invention are arranged in two dimensions, thereby achieving the objective described above.

A method for manufacturing an optical element module according to the present invention is provided, the method including: a step of adhering a securing tape to at least either of a front surface side or a back surface side of the optical element wafer according to the present invention, an optical element wafer module in which the plurality of optical element wafers are laminated, or the optical element wafer module according to the present invention; and a cutting step of simultaneously cutting the optical element wafer or the optical element wafer module along dicing lines to be individualized, thereby achieving the objective described above.

An electronic element wafer module according to the present invention includes: an electronic element wafer in which a plurality of electronic elements are arranged; a resin adhesion layer formed in a predetermined area on the electronic element wafer; a transparent support substrate covering the electronic element wafer and fixed on the resin adhesion layer; and the optical element wafer according to the present invention, an optical element wafer module in which the plurality of optical element wafers are laminated, or the optical element wafer module according to the present invention, any of which is adhered on the transparent support substrate so that each optical element corresponds to each of the plurality of electronic elements, thereby achieving the objective described above.

Preferably, in an electronic element wafer module according to the present invention, a space between the lower most optical element wafer and the electronic element is controlled by a planarized surface of a spacer section of the lower most optical element wafer and a planarized surface of the transparent support substrate in direct contact with each other.

Still preferably, in an electronic element wafer module according to the present invention, an adhesive is positioned in a space portion surrounded by a bottom portion on a further outer circumference side of a planarized surface of the spacer section of the lower most optical element wafer and the transparent support substrate, so that the lower most optical element wafer and the transparent support substrate are adhered to each other.

Still preferably, in an electronic element wafer module according to the present invention, the space portion by the bottom portion is a sufficient space for the adhesive to be put between and be spread from a top and bottom when adhering.

Still preferably, in an electronic element wafer module according to the present invention, the electronic element is an image capturing element including a plurality of light receiving sections for performing an electronic conversion on and capturing an image of image light from a subject.

Still preferably, in an electronic element wafer module according to the present invention, the electronic element is a light emitting element for outputting output light and a light receiving element for receiving incident light.

A method for manufacturing an electronic element module according to the present invention is provided, the method including: a step of adhering a securing tape to a front surface side of the optical element wafer or the optical element wafer module of the electronic element wafer module according to the present invention; and a cutting step of simultaneously cutting the electronic element wafer module from the electronic element wafer side along dicing lines to be individualized, thereby achieving the objective described above.

A method for manufacturing an electronic element module according to the present invention is provided, the method including: an image capturing element wafer unit forming step of adhering and fixing a transparent support substrate by a resin adhesion layer in such a manner to cover an electronic element wafer, in which a plurality of electronic elements are arranged, to form an image capturing element wafer unit; a cutting step of simultaneously cutting the image capturing element wafer unit from the electronic element wafer side along dicing lines to be individualized into image capturing element units; and a step of adhering the optical element module manufactured by the method for manufacturing the optical element module according to the present invention to the image capturing element unit in such a manner that the image capturing element corresponds to the optical element, thereby achieving the objective described above.

An electronic element module according to the present invention is provided, which is cut from the electronic element wafer module according to the present invention for each or a plurality of the electronic element modules, thereby achieving the objective described above.

An electronic information device according to the present invention includes an electronic element module individualized by cutting the electronic element wafer module according to the present invention, as a sensor module used in an image capturing section, thereby achieving the objective described above.

An electronic information device according to the present invention includes an electronic element module individualized by cutting the electronic element wafer module according to the present invention, used in an information recording and reproducing section, thereby achieving the objective described above.

An electronic information device according to the present invention includes an electronic element module manufactured by the method for manufacturing the electronic element module according to the present invention.

The functions of the present invention having the structures described above will be described hereinafter.

According to the present invention, an optical element support plate includes one or a plurality of through holes penetrating only an optical element area, and the optical element support plate is disposed inside a transparent resin material, which configures a plurality of optical elements. The optical element support plate has light shielding characteristics, an outer circumference side of the through hole of the optical element support plate is located inside a spacer section, and the outer circumference side of the through hole for a lens is formed thicker than a further outer circumference side thereof. As a result, the outer circumference portion and the further outer circumference portion of the through hole of the optical element support plate are connected with each other with a tapered surface for shielding light for the optical element area interposed therebetween. Thus, the side of the outer circumference portion of the through hole for a lens is formed thicker than the further side of the outer circumference portion thereof, so that the adhesive can be provided in the gap on the side of the further outer circumference portion, which is made by laminating the wafers on top of another. As a result, the light in the transverse direction enters through the thickness of the transparent lens resin without the adhesive after the manufacturing of the module, thereby further shielding the light.

According to the present invention with the structure described above, the optical element support plate includes one or a plurality of the through holes penetrating only the optical element area, and the optical element support plate is disposed inside the transparent resin material, which configures the plurality of optical elements. The optical element support plate has light shielding characteristics, the outer circumference side of the through hole of the optical element support plate is located inside the spacer section, and the outer circumference side of the through hole for a lens is formed thicker than the further outer circumference side thereof. As a result, it becomes possible to dispose the adhesive in the gap on the further side of the outer circumference portion by laminating the wafers on top of another when manufacturing the module, and therefore, the light in the transverse direction enters through the thickness of the transparent lens resin without the adhesive after the manufacturing of the module, thereby further shielding the light.

These and other advantages of the present invention will become apparent to those skilled in the art upon reading and understanding the following detailed description with reference to the accompanying figures.

Figure 1:
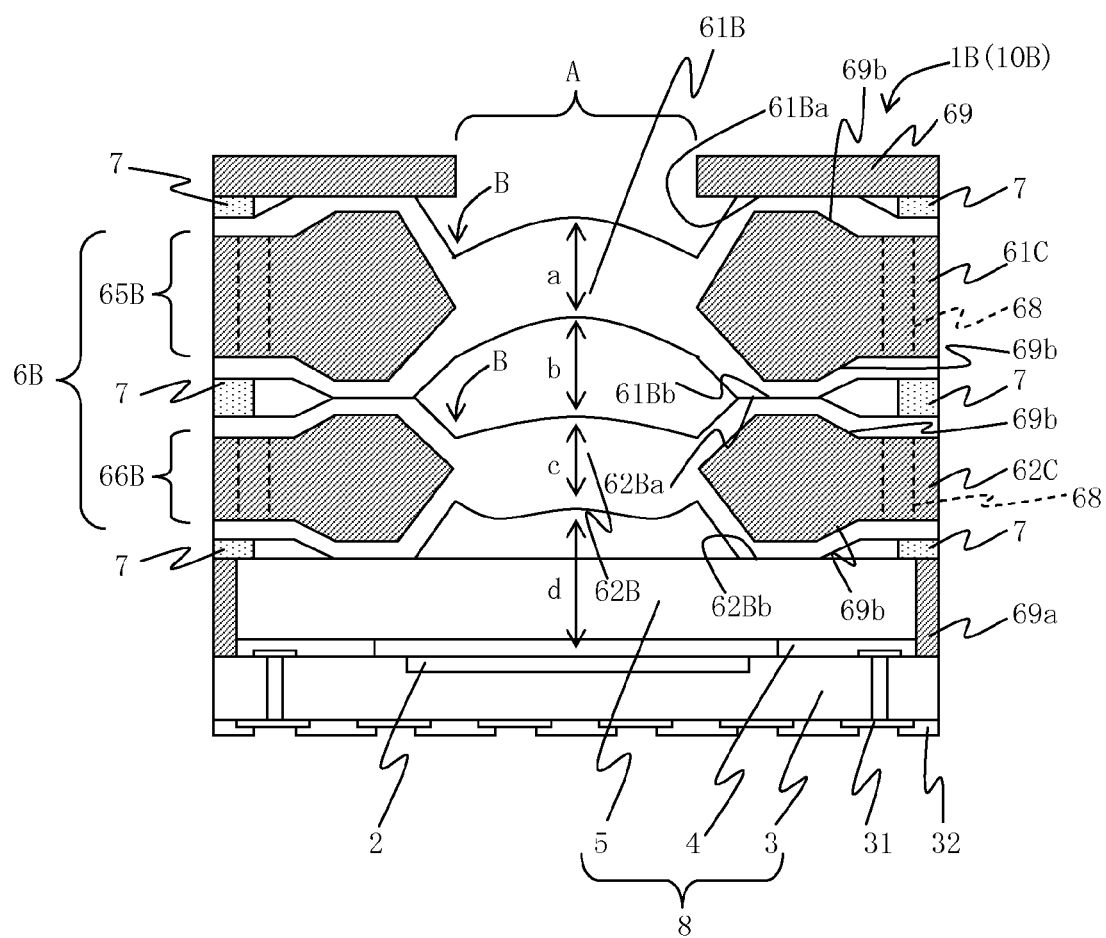
FIG. 1 is an essential part longitudinal cross sectional view illustrating an exemplary structure of an electronic element wafer module according to Embodiment 1 of the present invention.

1B image capturing element wafer module
2 (electronic element wafer module)
2 image capturing element (electronic element)
3 image capturing element wafer
31 external connection terminal
32 insulation film
4 resin adhesion layer
5 transparent support substrate
6B lens wafer module (optical element wafer module)
61B first lens
61Ba, 61Bb, 62Ba, 62Bb protruded section (spacer section)
61C, 62C lens support plate
62B second lens
65B first lens wafer (optical element wafer)
66B second lens wafer (optical element wafer)
7, 7a adhesive
7b space portion 71, 72 vent
8 image capturing element wafer unit
80 image capturing element unit
81 upper metal mold
82 lower metal mold
83 transparent resin material
9a cut-securing tape
9b surface-protecting tape
184, 184A, 184B, 184a first lens
185, 185A, 185a second lens
186, 186A lens module
187 light shielding holder
187B light shielding holder wafer
188, 189 lens module
189B lens wafer module
10B, 10C image capturing element module (sensor module)
90 electronic information device
91 solid-state image capturing apparatus
92 memory section
93 display section
94 communication section
95 image output section
A optical surface
B outer circumference end portion
DL dicing line
F1 planarized section
F2 annular protruded section

DESCRIPTION OF THE PREFERRED EMBODIMENTS

Hereinafter, as Embodiment 1 of an optical element wafer, an optical element wafer module, a method for manufacturing an optical element module, an electronic element wafer module, an electronic element module, and a method for manufacturing the electronic element module according to the present invention, the case where the present invention is applied to a lens wafer, a lens wafer module, a method for manufacturing a lens module, an image capturing element wafer module, an image capturing element (sensor module) and a method for manufacturing the image capturing element module, will be described in detail with reference to the attached figures. Further, as Embodiment 2 of an optical element individualized from the optical element wafer, and an optical element module individualized from the optical element wafer module, a lens and a lens module will be described in detail with reference to the attached figures. Further, as Embodiment 3, an electronic information device, such as a camera-equipped cell phone device and a television telephone device, will be described in detail with reference to the attached figures, and the electronic information device includes the image capturing element module with the lens or lens module of Embodiment 2 used therein, or the image capturing element module of Embodiment 1, as a sensor module in an image capturing section, which functions as an image input section, of the electronic information device.

(Embodiment 1)

FIG. 1 is an essential part longitudinal cross sectional view illustrating an exemplary unitary structure of an electronic element wafer module according to Embodiment 1 of the present invention.

In FIG. 1, an image capturing element wafer module 1B as the electronic element wafer module of Embodiment 1 includes: an image capturing element wafer 3, as an electronic element wafer, in which a plurality of image capturing elements 2 are arranged in a matrix, the image capturing elements 2 including a plurality of light receiving sections for performing a photoelectric conversion on and capturing an image of image light from a subject; a resin adhesion layer 4 formed on the image capturing element wafer 3 and in between adjacent image capturing elements 2; a transparent support substrate 5, such as a glass plate, adhered and fixed on the resin adhesion layer 4; and a lens wafer module 6B, as an optical element wafer module, provided such that lens positions correspond to the plurality of respective image capturing elements 2. FIG. 1 illustrates a single unit image capturing element module of the image capturing element wafer module 1B, and in an actual condition, a large number of the unitary image capturing element modules are provided and the large number of image capturing element modules are individualized by the cutting of the image capturing element wafer module 1B.

The image capturing element wafer 3 includes a large number of the image capturing elements 2 in a matrix on the front surface side (a plurality of light receiving sections, which constitute a plurality of pixels, are provided for each image capturing element 2), and a plurality of through holes penetrating a wafer back surface to below a pad (electrode pad) of a front surface for each image capturing element 2. A side wall and back surface of each of the through holes are covered with an insulation film, and a wiring layer contacting the pad is formed to the back surface through the through hole. An insulation film 32 is formed on an external connection terminal 31, which is connected to the wiring layer, and on the back surface. The insulation film 32 has an opening at a portion where a solder ball (not shown) is formed above the external connection terminal 31 of the wiring layer, so that the solder ball (not shown) is formed exposed to the outside. Herein, a case has been described where the image capturing element wafer 3 includes a penetrating electrode for each image capturing element 2; however there is also a case where such penetrating electrode is not included.

The resin adhesion layer 4 is formed in the periphery part of the image capturing element 2 on the wafer surface to adhere the image capturing element wafer 3 and the transparent support substrate 5. When the upper part of the semiconductor surface is covered by the transparent support substrate 5, the resin adhesion layer 4 encloses an internal space above a sensor area where the image capturing element 2, as an electronic element, above the image capturing element wafer 3 is provided. The resin adhesion layer 4 is formed at a predetermined location on the image capturing element wafer 3 using an ordinary photolithography technique. The transparent support substrate 5 is adhered on the resin adhesion layer 4. In this case, the resin adhesion layer 4 can also be formed using a screen printing method or a dispense method, other than the photolithography technique.

The lens wafer module 6B includes a first lens wafer 65B and a second lens wafer 66B laminated on the transparent support substrate 5 in such a manner to correspond to the image capturing element 2. The first lens wafer 65 is constituted of a plurality of first lenses 61B. The second wafer 66 is constituted of a plurality of second lenses 62B. An optical surface A of the first lens 61B is in a shape of a convex lens and is externally protruded. The outer circumference portion of the optical surface A is annularly protruded more than the most-protruded top portion at the center portion of the optical surface A. In FIG. 1, annularly protruded sections 61Ba and 61Bb of the optical surface A are illustrated as a planarized surface in the first lens 61B; however, without the limitation to the annular planarized surface, any shape can be included, such as a circular arc protruded section or a wavy shape with circular arc protruded sections arranged on one column, as long as it is an annular protruded section.

In the second lens 62B, both the front surface and the back surface are a convex shaped optical surface A, and protruded sections 62Ba and 62Bb are annularly protruded from an outer circumference end portion B, which is the outer circumference of the optical surface A, and are higher than the convex shape of the optical surface A, and the top surface is a planarized surface. The annular protruded section 61Bb, which is on the outer circumference side of the optical surface A on the back surface of the first lens 61B, and the annular protruded section 62Ba, which is on the outer circumference side of the optical surface A on the front surface of the second lens 62B, contact each other at the respective planarized surfaces. An adhesive 7 is provided in a space made by lower portions or bottom portions (step portions) further outside of the annular protruded sections 61Bb and 62Ba. The first lens 61B and the second lens 62B are vertically adhered and fixed to each other at the space in between them by the adhesive 7. Similar to this, the transparent support substrate 5 and the annular protruded section 62Bb, at the outer circumference end portion B of the optical surface A on the back surface, contact each other at the respective planarized surfaces. The adhesive 7 is provided in the space made by the lower portion or bottom portions (step portions) on the further outside of the annular protruded section 62Bb. The transparent support substrate 5 and the second lens 62B are vertically adhered and fixed to each other at the space in between them by the adhesive 7.

Because of the structure described above, the space between the first lens 61B and the second lens 62B as well as the space between the second lens 62B and the transparent support substrate 5 touch each other and are regulated by the respective planarized surfaces of the annular protruded sections 61Bb and 62Ba and the annular protruded section 62Bb. As a result, the variation of the thickness or amount of the adhesive 7 will not negatively influence the lens module 6B, and the overall thickness of the lens module 6B becomes stable. That is, the space between the lenses are determined by the contacting surfaces (protruded sections 61Bb, 62Ba and 62Bb) of the first lens 61 and the second lens 62, and the adhesion is made by the adhesive 7 in the space portion made by the bottom portion further out side the contacting surfaces. Therefore, even if the amount of the adhesive 7 is too much, the adhesive 7 only spreads within the gap portion, and the variation of the thickness or amount of the adhesive 7 does not cause a problem. As a result, the thickness of the overall lens module 6B becomes stable, and further, the optical characteristics of the lens module 6B become stable.

That is, the contacting surface of the first lens wafer 65B and the contacting surface of the second lens wafer 66B directly contact each other, and the contacting surface of the second lens wafer 66B and the transparent support substrate 5 directly contact each other, so as to adhere them at the gap portions of the outer circumference portions. As a result, the first lens wafer 65B and the second lens wafer 66B can be manufactured with high precision, so that a lens space b and a space d between the lens and the image capturing element 2 do not vary. In this case, the adhesive 7 is provided in a space portion (gap portion) made by the bottom portion (step portion) on the further outer circumference side of the lens contact surface. The adhesive 7 does not fill the space portion (gap portion) made by the bottom portion (step portion), but the adhesive 7 is provided in the space portion (gap portion) in such a manner to leave a partial space therein, so that the adhesive 7 only spreads within the space even if the amount of the adhesive 7 is too much, and the variation of the thickness or amount of the adhesive 7 does not cause a problem. As a result, the thickness of the overall lens module 6B becomes stable, and the optical characteristics of the lens module 6 become stable.

The lens space b and the space d between the lens and the image capturing element 2 in this case vary largely due to the thickness of the adhesive 7 because the adhesive 7 is put between the first lens wafer 65B and the second lens wafer 66B, and the adhesive 7 is put between the second lens wafer 66B and the upper surface of the transparent support substrate 5, as conventionally performed. For example, when an adhesive sheet with the adhesive 7 of the thickness of 50 μm is used, the variation will be plus or minus 10 μm. When the adhesive 7 is in a liquid form, the variation will be greater at the application of the adhesive 7.

Further, at the time of the conventional reflow soldering (soldering process at 250 degrees Celsius), when the internal enclosed space between the lenses expands, there is no escape route for inside air. Because of this, the first lens wafer 65B and the second lens wafer 66B with the adhesive 7 interposed therebetween, and the second lens wafer 66B and the transparent support substrate 5 are peeled off, in addition to the image capturing element wafer 3 and the transparent support substrate 5 with the resin adhesion layer 4 interposed therebetween. In order to solve this problem, the resin adhesion layer 4 and the adhesive 7 are formed in such a manner not to surround the circumference completely but to provide an air hole (vent).

FIGS. 2(a) to 2(c) and FIG. 3 describe such an example.

In FIG. 2(a), the adhesive 7 is provided along the four sides up to the dicing line DL on the outer circumference side of the lens optical surface A. In this case, a part of the adhesive 7 in a quadrilateral shape with a predetermined width is removed to form a vent 71 for ventilation with the inside. An adhesive 7a is positioned inside the space formed with the adhesive 7, facing the opening made by removing a corner portion. Positioning the adhesive 7a facing the opening (vent 71) will prevent dust from coming from the outside to a space portion 7b inside the lens optical surface A. With the adhesive 7a alone, which is positioned facing the opening (vent 71), it is possible to adhere and capture dust by allowing the adhesive 7a to be cohesive even after the curing of the resin.

In FIG. 2(b), the vent 71 is formed at one corner portion of the adhesive 7 in a quadrilateral shape with a predetermined width, and at four corner portions, four adhesives 7a, which are cohesive even after the curing of the resin, are provided for capturing dust facing the corner portions. As a result, the performance for capturing dust is improved due to the increased number of the adhesives 7a.

In FIG. 2(c), a plurality of narrow vents 72 (three vents herein) are formed at least at one side of the adhesive 7 in a quadrilateral shape with a predetermined width. Again, three adhesives 7a, which are cohesive even after the curing of the resin, are provided for capturing dust, facing the respective vents inside the space. Furthermore, two adhesives 7a are provided at the rest of the two corner portions. As a result, the performance for capturing dust is improved due to the increased number of the adhesives 7a. The vent 72 itself is formed as small as possible so as to prevent the penetration of the cutting water. It is also possible to apply the adhesive 7 in a mountain shape and define a gap between the mountains as the vent 72. In addition, it is also possible to form the vent 72 in the adhesive 7 by reducing the amount of the adhesive 7.

Figure 2:
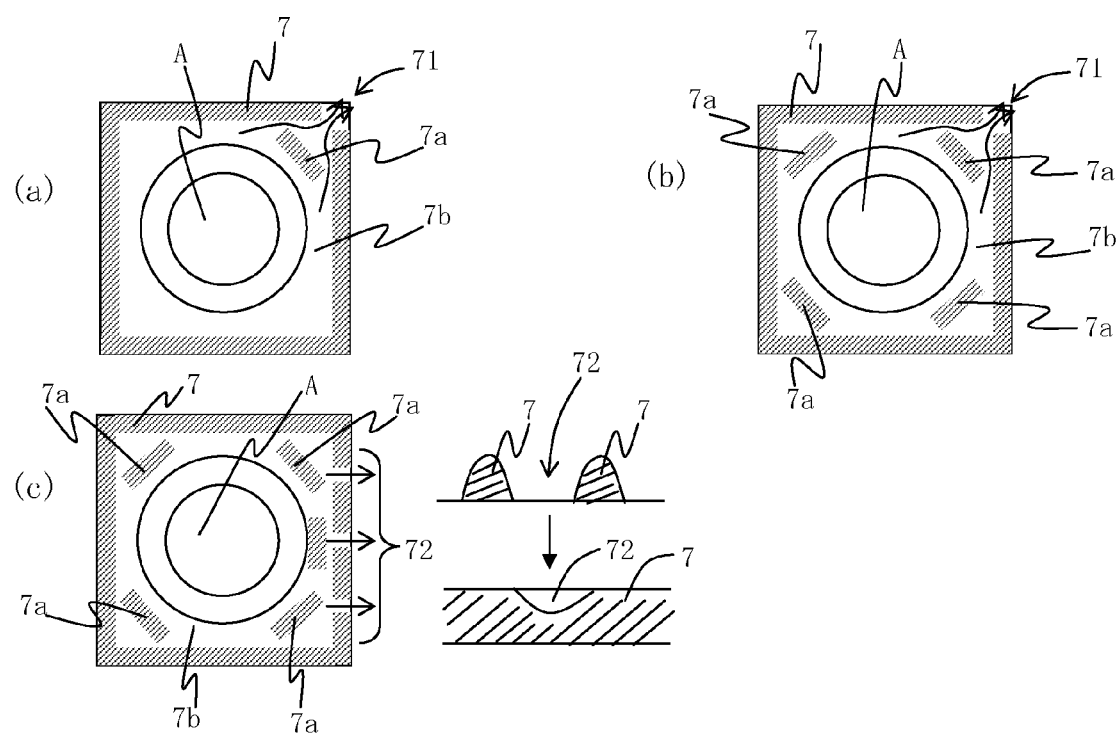
FIGS. 2(a) to 2(c) are each a plane view schematically illustrating an example of an adhesive positioning structure when the adhesive of FIG. 1 does not surround all the outer circumference but a vent is provided at a part.
Figure 3:
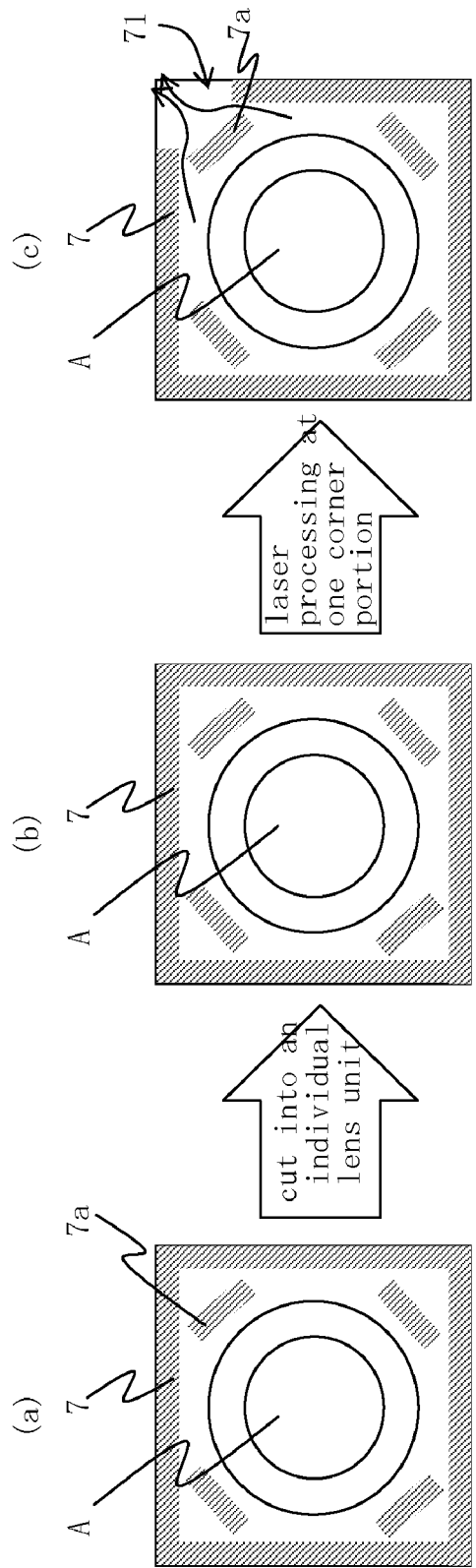
FIGS. 3(a) to 3(c) are each a plane view schematically illustrating another example of an adhesive positioning structure when the adhesive of FIG. 1 does not surround all the outer circumference but a vent is provided at a part.

In FIG. 3, in order to prevent the cutting water from penetrating the space portion 7b inside the lens optical surface A, the process for a air passing hole (vents 71 and 72, for example) of the lens is performed after the cutting of the individual lens unit, instead of performing it at the application of the adhesive 7 or 7*a* as in FIGS. 2(*a*) to 2(*c*). In FIG. 3(*a*), the adhesive 7 is applied to all the circumference portions of the lens optical surface A in a quadrilateral shape along the four sides using a dispensing method. The adhesive 7*a* for capturing dust, which is cohesive even after the curing of the resin, is applied inside the adhesive 7 in a quadrilateral shape and outside the lens optical surface A, facing each of the corner portions.

Subsequently, In FIG. 3(*b*), the adhesive 7 is applied in a quadrilateral shape, and the resin curing process is performed on the adhesive 7 by the ultraviolet ray (UV) radiation. Further, the cutting process for the individual lens units is performed.

Further, in FIG. 3(*c*), a cutting process is performed on one corner portion of the quadrilateral adhesive 7 using laser light to form the vent 71 as an air passing hole.

That is, in a plan view, the adhesive 7 is provided at a predetermined width outside the lens area (lens optical surface A) and inside the quadrilateral along the dicing line. The vent 71 and/or 72 are provided at least at one corner portion and/or one side portion of the four corner portions and four side portions of the quadrilateral adhesive 7. Furthermore, in a plan view, the adhesive 7*a* for capturing dust, which is cohesive even after the curing of the resin, is provided outside the lens area and inside the quadrilateral along the dicing line. Part or all of the adhesive 7*a* for capturing dust is provided in such a manner to face the vent 71 and/or 72 in the space portion 7*b* inside the outer vent in a plan view.

Alternatively, a lens support plate 61C is provided inside the transparent lens material of each first lens 61B of the first lens wafer 65B. The lens support plate 61C includes a through hole penetrating only a lens shape area, which is the lens optical surface A of a convex shape. Further, a lens support plate 62C is provided inside the transparent lens material of each second lens 62B of the second lens wafer 66B. The lens support plate 62C includes a through hole penetrating only a lens shape area, which is the lens optical surface A of a convex shape.

In this case, for the shielding of light for the image capturing element 2 from above, a light shielding plate 69 having an opening (window) above the lens optical surface A is provided by being adhered by the adhesive 7 on the front surface side of each first lens 61B of the first lens wafer 65B. Further, the shielding of light for the image capturing element 2 from the side is performed by the lens support plates 61C and 62C. The lens support plates 61C and 62C include through holes penetrating only a lens shape area (area corresponding to the lens optical surface A). A taper is provided for the through hole. The outer circumference side of the through hole is configured to be thicker than the further outer circumference side. The circumference portion of the through hole is expanded so that it becomes difficult for the light from the side to pass it through, and a tapered section 69*b* is provided on the further outer circumference side. A light shielding material 69*a* is positioned on the side wall of the transparent support substrate 5. Carbon is mixed, to provide a light shielding function, in the adhesive 7 between the light shielding plate 69 and the first lens wafer 65, the adhesive 7 between the first lens wafer 65B and the second lens wafer 66B, and the adhesive 7 between the second lens wafer 66B and the transparent support substrate 5. These adhesives enable shielding of light from the image capturing element 2 in a more definite manner.

The lens thicknesses a and c of the first lens wafer 65B and the second lens wafer 66B vary. This is because the transparent lens resin does not have a place to escape from the pressure of the metal mold. Therefore, when the amount of the transparent lens resin is high, the contact pressure becomes high and the lens thicknesses a and c also become thick. The peripheral portion of each through hole of the lens support plates 61C and 62C expands, and a through hole 68 is provided on the further outer circumference side. Because of the through hole 68, when the transparent lens resin material is put between the metal molds, the resin material will have a space to escape through the through hole 68 due to the pressure of the metal molds, and the contact pressure on the resin material will not become high during the forming of the resin. Because of this, it becomes possible to avoid the variation of the lens thicknesses a and c of the first lens wafer 65B and the second lens wafer 66B. Further, instead of or together with the through hole 68, a front portion of the trough hole 68 can be widened or recessed so that it also becomes possible to control the contact pressure to the resin material at the forming stage.

First, a method for forming the first lens wafer 65B in FIG. 1 will be described in detail with reference to FIGS. 4(*a*) to 4(*c*).

Figure 4:
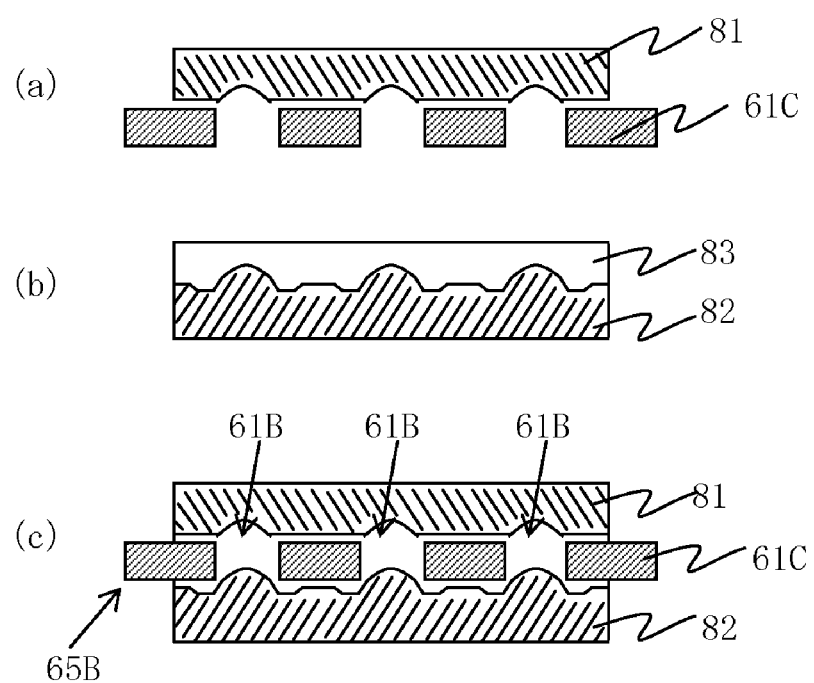
FIGS. 4(a) to 4(c) are each an essential part longitudinal cross sectional view illustrating one example of a forming method of a first lens wafer of FIG. 1.

As illustrated in FIG. 4(*a*), the lens support plate 61C, which includes a plurality of through holes, is mounted on the lens front surface shape side of the upper metal mold 81 corresponding to the lens front surface shape of the first lens wafer 65B by positioning the lens support plate 61C such that the lens shape areas corresponds to the through holes.

Next, as illustrated in FIG. 4(*b*), a transparent resin material 83 is positioned on the lower metal mold 82 corresponding to the lens back surface shape of the first lens wafer 65B.

Further, as illustrated in FIG. 4(*c*), the lens support plate 61C and the transparent resin material 83 are put between and pressed by the upper metal mold 81, on which the lens support plate 61C is positioned, and the lower metal mold 82, on which the transparent resin material 83 is positioned, from the top and bottom. At this stage, the transparent resin material 83 of the first lens 61B is controlled so as to have a predetermined lens thickness. The formed transparent resin material 83 forms the first lens wafer 65B in which a plurality of first lens 61B are successively arranged in a two dimensional matrix at a wafer scale. Any of ultraviolet ray (UV) curing resin, thermosetting resin, and UV and heat curing resin can be used as the transparent resin material 83.

Next, another method for forming the first lens wafer 65B of FIG. 1 will be described in detail with reference to FIGS. 5(*a*) to 5(*c*).

Figure 5:
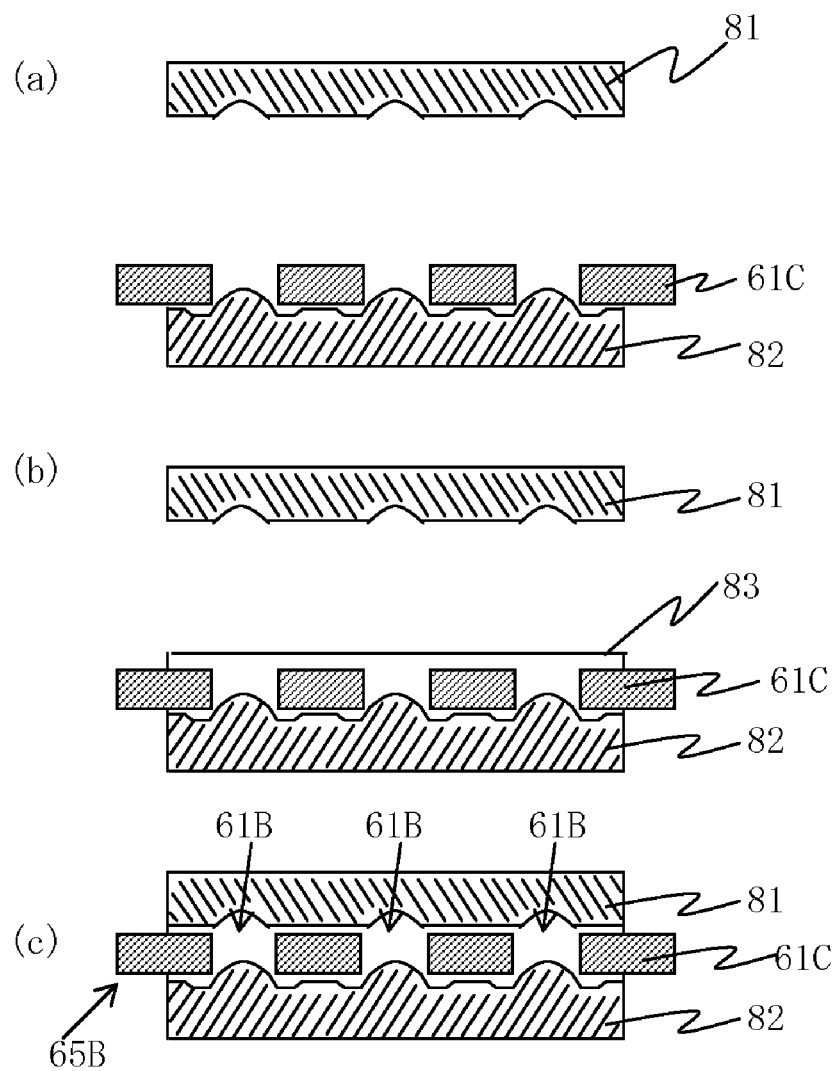
FIGS. 5(a) to 5(c) are each an essential part longitudinal cross sectional view illustrating another example of a forming method of a first lens wafer of FIG. 1.

As illustrated in FIG. 5(*a*), the lens support plate 61C, which includes a plurality of through holes, is mounted on the lens back surface shape side of the lower metal mold 82 corresponding to the lens back surface shape of the first lens wafer 65B by positioning the lens support plate 61C such that the lens shape areas corresponds to the through holes.

Next, as illustrated in FIG. 5(*b*), the transparent resin material 83 is positioned on the lens support plate 61C on the lower metal mold 82 corresponding to the lens back surface shape of the first lens wafer 65B.

Further, as illustrated in FIG. 5(*c*), the lens support plate 61C and the transparent resin material 83 are put between and pressed by the upper metal mold 81 and the lower metal mold 82, on which the lens support plate 61C and the transparent resin material 83 are positioned, from the top and bottom. At this stage, the transparent resin material 83 of the first lens 61B is controlled so as to have a predetermined lens thickness. The formed transparent resin material 83 forms the first lens wafer 65B in which a plurality of first lens 61B are successively arranged in a two dimensional matrix at a wafer scale. Any of ultraviolet ray (UV) curing resin, thermosetting resin, and UV and heat curing resin can be used as the transparent resin material 83.

Next, another method for forming the first lens wafer 65B of FIG. 1 will be described in detail with reference to FIGS. 6(a) and 6(b).

Figure 6:
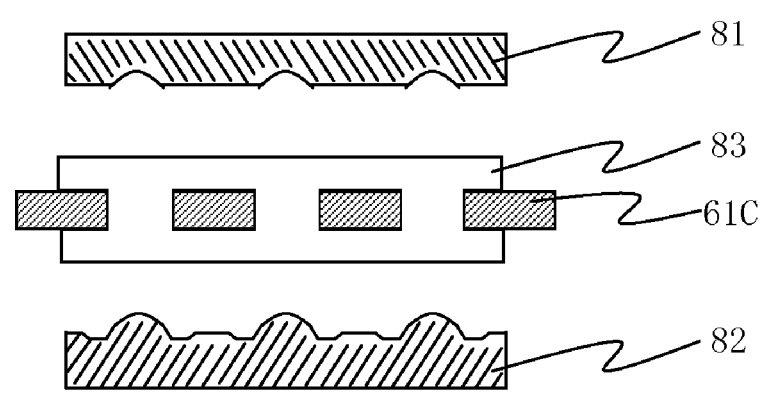
FIGS. 6(a) and 6(b) are each an essential part longitudinal cross sectional view illustrating still another example of a forming method of a first lens wafer of FIG. 1.
Figure 6:
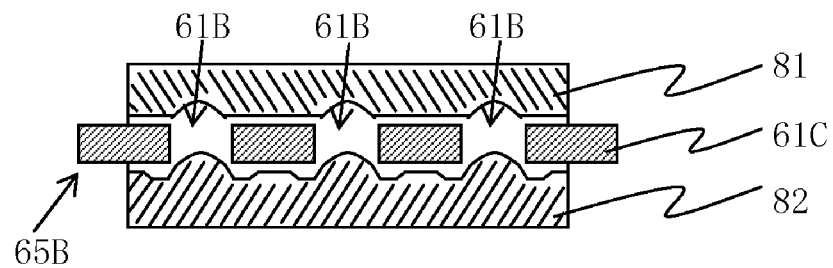

As illustrated in FIG. 6(a), the transparent resin material 83 is applied and positioned on the lens support plate 61C, which includes a plurality of through holes.

Next, as illustrated in FIG. 6(b), in a state where the lens shape area and the through hole are positioned corresponding to each other, the lens support plate 61C, on which the transparent resin material 83 is applied, is put between and pressed by the upper metal mold 81 corresponding to the lens front surface shape of the first lens wafer 65B and the lower metal mold 82 corresponding to the lens back surface shape of the first lens wafer 65B from the top and bottom. At this stage, the transparent resin material 83 of the first lens 61B is controlled so as to have a predetermined lens thickness. The formed transparent resin material 83 forms the first lens wafer 65B in which a plurality of first lens 61B are successively arranged in a two dimensional matrix at a wafer scale. Any of ultraviolet ray (UV) curing resin, thermosetting resin, and UV and heat curing resin can be used as the transparent resin material 83.

According to Embodiment 1 as described above, the lens support plate 61C, which includes one or a plurality of through holes penetrating only the lens area (optical surface A), is provided in the first lens wafer 65B. Still further, the lens support plate 62C, which includes one or a plurality of through holes penetrating only the lens area (optical surface A), is provided in the second lens wafer 66B. The lens support plates 61C and 62C are black and have light shielding characteristics. The outer circumference side (protruded shape portion) of the through holes of the lens support plates 61C and 62C are positioned inside the protruded portions 61Ba and 61Bb as well as the protruded portions 62Ba and 62Bb as a spacer section; and the outer circumference side (protruded shape portion) of the through hole for the lens is formed thicker than the further outer circumference side (step portion). As a result, the outer circumference portion (protruded shape portion) and the further outer circumference portion (step portion) of the through holes of the lens support plates 61C and 62C are connected to each other with a light-shielding tapered surface for the lens area side interposed therebetween. As described above, the side of the outer circumference portion (protruded shape portion) of the through hole for the lens is formed thicker than the side of the further outer circumference portion (step portion) thereof, so that the adhesive 7 can be provided in the gap on the side of the further outer circumference portion (step portion), which is made by laminating the lenses on top of another. As a result, after the manufacturing of the module, the adhesive 7 does not exist at the location where the light cones through and enters, and the light from the transverse direction enters only through the space of the film thickness of the transparent lens resin to the side of the lens area, thereby shielding the light even more.

Further, the surface height of the spacer section provided on the outer circumference side of the optical surface A functioning as an optical element area is configured to be higher than the surface height of the optical surface A at the center portion. Therefore, in the manufacturing process, the optical surface A of the lens can be prevented from becoming dirty by the cutting water when cutting, the reduction of the optical characteristics can be controlled, and the surface of the optical element, such as a convex lens surface that functions optically, can be maintained clean. A cut-securing tape 9a and a surface-protecting tape 9b are adhered on a front surface and a back surface of a lens wafer module to be cut, individualizing the lens wafer module into lens modules. However, there is also a method for cleaning the optical surface A by spin cleaning without adhering the surface-protecting tape 9b but maintaining the cut-securing tape 9a on the lens after the cutting. Thus, the adhering of the cut-securing tape 9a is essential, but the adhering of the surface-protecting tape 9b is not essential. It is possible to clean the lens surface by spin cleaning without using the surface-protecting tape. Therefore, it is suitable for the spacer section to be higher than the lens surface (optical surface A) on either the front surface or back surface of the lens.

(Embodiment 2)

In Embodiment 2, the lens as an optical element and the lens module as an optical element module will be described in detail.

Figure 7:
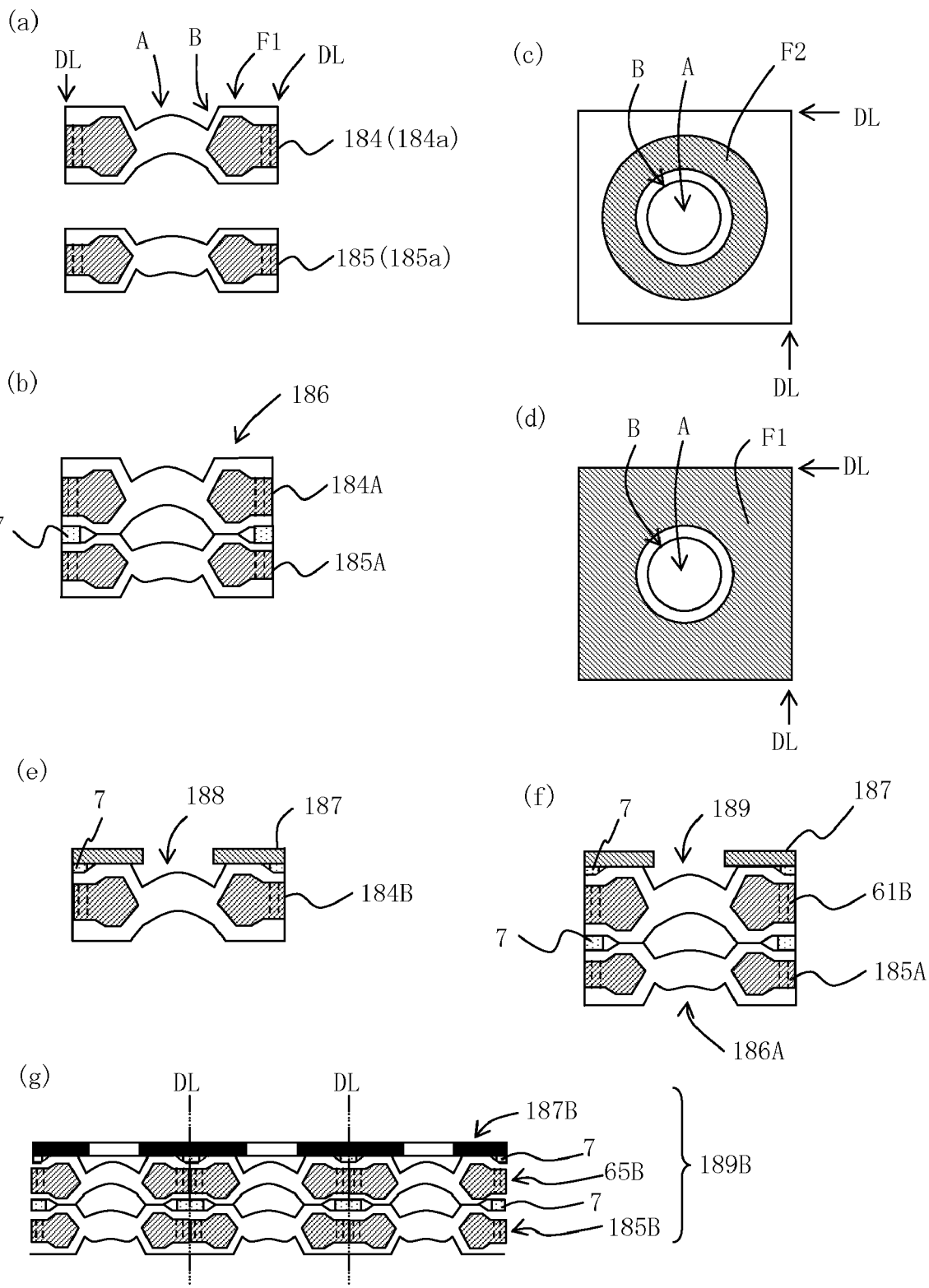
FIG. 7(a) is a longitudinal cross sectional view illustrating an exemplary variation of each lens of FIG. 1 as Embodiment 1.
FIG. 7(b) is a longitudinal cross sectional view illustrating an exemplary variation of a lens module of FIG. 1.
FIG. 7(c) is a top view of a first lens of FIG. 1.
FIG. 7(d) is a top view of a first lens of FIG. 7(a).
FIG. 7(e) is a longitudinal cross sectional view of a lens module in which the first lens of FIG. 7(a) is combined with the light shielding holder.
FIG. 7(f) is a longitudinal cross sectional view of a lens module in which the exemplary variation of the lens module of FIG. 7(b) is combined with the light shielding holder.
FIG. 7(g) is a longitudinal cross sectional view illustrating an exemplary essential part structure of a lens wafer module in which a light shielding holder wafer, a first lens wafer and a second lens wafer are laminated.

FIG. 7(a) is a longitudinal cross sectional view illustrating an exemplary variation of each lens of FIG. 1. FIG. 7(b) is a longitudinal cross sectional view illustrating an exemplary variation of the lens module of FIG. 1. FIG. 7(c) is a top view of the first lens of FIG. 1. FIG. 7(d) is a top view of the first lens of FIG. 7(a). FIG. 7(e) is a longitudinal cross sectional view of a lens module in which the first lens of FIG. 7(a) is combined with the light shielding holder. FIG. 7(f) is a longitudinal cross sectional view of a lens module in which the exemplary variation of the lens module of FIG. 7(b) is combined with the light shielding holder. FIG. 7(g) is a longitudinal cross sectional view illustrating an exemplary essential part structure of a lens wafer module in which a light shielding holder wafer 187B, a first lens wafer 65B and a second lens wafer 185B are laminated.

It is possible to obtain a large number of first lenses 184 as well as second lenses 185 as illustrated in FIG. 7(a) by cutting the first and second lens wafers 65B and 66B along the dicing lines DL. A spacer section with a predetermined thickness is provided at each of the outer circumference sides of the lens optical surface A of the center portion in the first and second lenses 184 and 185. As illustrated by the shaded portion of the outer quadrilateral and inner circle in the plan view in FIG. 7(d), the spacer section is a planarized section F1, which is protruded from the circular outer circumference portion B surrounding the optical surface A, the spacer section being higher than the convex shape of the optical surface A. In the first and second lenses 184 and 185, the optical surface A and the spacer section are simultaneously formed with a transparent resin material. In the first lens 61B of a quadrilateral in the plan view of FIG. 7(f), as illustrated by the annular shaded portion of FIG. 7(c), the spacer section is an annular protruded section F2, which is protruded from the circular outer circumference portion B surrounding the optical surface A, the protruded section F2 being protruded higher than the convex shape of the optical surface A. Therefore, the difference between the first and second lenses 61B and 62B of FIG. 8 and the first and second lenses 184 and 185 of FIG. 7(a) is whether they have the annular protruded section F2 or planarized section F1 both on the front and back surfaces.

Further, a lens module 186 illustrated in FIG. 7(b) can be obtained by simultaneously cutting along the dicing lines DL in the state where the first lens wafer, in which a plurality of first lenses 184A are formed, and the second lens wafer, in which a plurality of second lenses 185A are formed, are adhered on top of another by the adhesive 7. Again, in the cutting stage, a cut-securing tape is adhered on the planarized section F1 of the lower second lens wafer, and a surface-protection tape for protecting the lens surface is adhered on the planarized section F1 of the upper first lens wafer, as similar to the cutting of the first lenses 184A and the second lenses 185A. As a result, during the cutting stage, the respective lens optical surfaces of the first and second lenses 184A and 185A are sealed and protected by the cut-securing tape and the surface-protecting tape, so that the lens optical surfaces do not become dirty from the cutting water. However, there is also a method for cleaning the optical surface A by spin cleaning without adhering the surface-protecting tape 9b but maintaining the cut-securing tape 9a on the lens after the cutting. Thus, the adhering of the cut-securing tape 9a is essential, but the adhering of the surface-protecting tape 9b is not essential. It is possible to clean the lens surface by spin cleaning without using the surface-protecting tape. Therefore, it is suitable for the spacer section to be higher than the lens surface (optical surface A) on either the front surface or back surface of the lens.

The difference between the lens module 186 illustrated in FIG. 7(b) and the lens module (first lens 61B and second lens 62B) of FIG. 1 is whether they have the annular protruded section F2 or planarized section F1 both on the front and back surfaces.

In this case, the annular planarized surface of the spacer section of the upper first lens 184A directly contacts with the annular planarized surface of the spacer section of the lower second lens 185A, and the adhesive 7 is provided in the space portion surrounded by the bottom portion on the further outer circumference side of each planarized surface, so that the first lens 184A is adhered to the second lens 185A.

Further, the first lens 184A in FIG. 7(a), includes the optical surface A and the planarized section F1 on the front surface, the planarized section F1 being more protruded than the optical surface A. In this case, the first lens 184a and the second lens 185 are provided together as a set. Further, when the lens of the second lens 185a is protruded, the first lens 184 and the second lens 185a are provided as a set. Even if the optical surface A of the front surface of the second lens 185a is protruded, it fits in the concave portion of the back surface of the first lens 184. The optical surface A and the planarized section F1, which is more protruded than the optical surface A, are provided only on the back surface of the second lens 185a. Because of this, each lens optical surface A does not become dirty from the cutting water, as described above.

In summary, it is proper as long as the optical surface A and the more protruded, protruded section F2 or planarized section F1 are provided at least on either of the front surface or the back surface.

Further, as illustrated in FIG. 7(e), a lens module 188 can be configured by laminating a light shielding holder 187 on the first lens 184 of FIG. 7(a) by the adhesive 7 in such a manner that the optical surface A aligns with the opening of the light shielding holder 187. Further, as illustrated in FIG. 7(f), a lens module 189 can be configured by laminating the light shielding holder 187 by the adhesive 7 on a lens module 186A, which is configured of the first lens 61B of FIG. 1 and the second lens 185A of FIG. 7(b) in such a manner that the optical surface A aligns with the opening of the light shielding holder 187. Thus, the lens and the light shielding holder 187 are provided as a set to configure a lens module.

The lens modules 188 and 189 can also be manufactured using another manufacturing method. As illustrated in FIG. 7(g), a lens wafer module 189B can be manufactured as an optical element wafer module by laminating the first lens wafer 65B as an optical element wafer, a second lens wafer 185B as an optical element wafer and a light shielding holder wafer 187B by the adhesive 7. In this case, the first lens wafer 65B and the light shielding holder wafer 187B may be laminated first by the adhesive 7 in such a manner that the optical surface A aligns with an opening of the light shielding holder 187B, and subsequently, the second lens wafer 185B may be laminated therebelow in such a manner that the optical surfaces A align with one another. Further, the first lens wafer 65B and the second lens wafer 185B may first be laminated by the adhesive 7 in such a manner that the optical surfaces A are aligned with one another, and subsequently, the light shielding holder wafer 187B may be adhered thereabove in such a manner that the optical surfaces A align with the opening of the light shielding holder wafer 187B. Further, the light shielding holder wafer 187B may be adhered by the adhesive 7 on a front surface side of a lens wafer module constituted of the first lens wafer 65B and the second lens wafer 185B in such a manner that the optical surfaces A align with the opening of the light shielding holder wafer 187B.

Next, as illustrated in FIG. 7(g), the lens wafer module 189B is simultaneously cut at the dicing lines DL between the lenses using a dicing blade or a dicing wire to be individualized for each lens. At this stage, the process is performed while a cut-protection tape and a cut-securing tape are adhered respectively on the front and back surfaces of the lens wafer module 189B. The lens module 189 can also be manufactured by the above described method. However, there is also a method for cleaning the optical surface A by spin cleaning without adhering the surface-protecting tape 9b but maintaining the cut-securing tape 9a on the lens after the cutting. Thus, the adhering of the cut-securing tape 9a is essential, but the adhering of the surface-protecting tape 9b is not essential. It is possible to clean the lens surface by spin cleaning without using the surface-protecting tape. Therefore, it is suitable for the spacer section to be higher than the lens surface (optical surface A) on either the front surface or back surface of the lens.

In Embodiment 2, for example, a combination of two lenses (lens module 186) of the first lens 184 and the second lens 185, or for example, a single lens of the first lens 184 have been described; however, without the limitation to these, it is also possible to combine three or more lenses as an optical element to configure a lens module as an optical element module. Other optical elements may be used instead of the lens, the other optical elements including a prism and an optical function element (hologram optical element, for example). The prism and optical function element (hologram optical element, for example) can be formed in the optical surface A of the lens.

(Embodiment 3)

Figure 8:
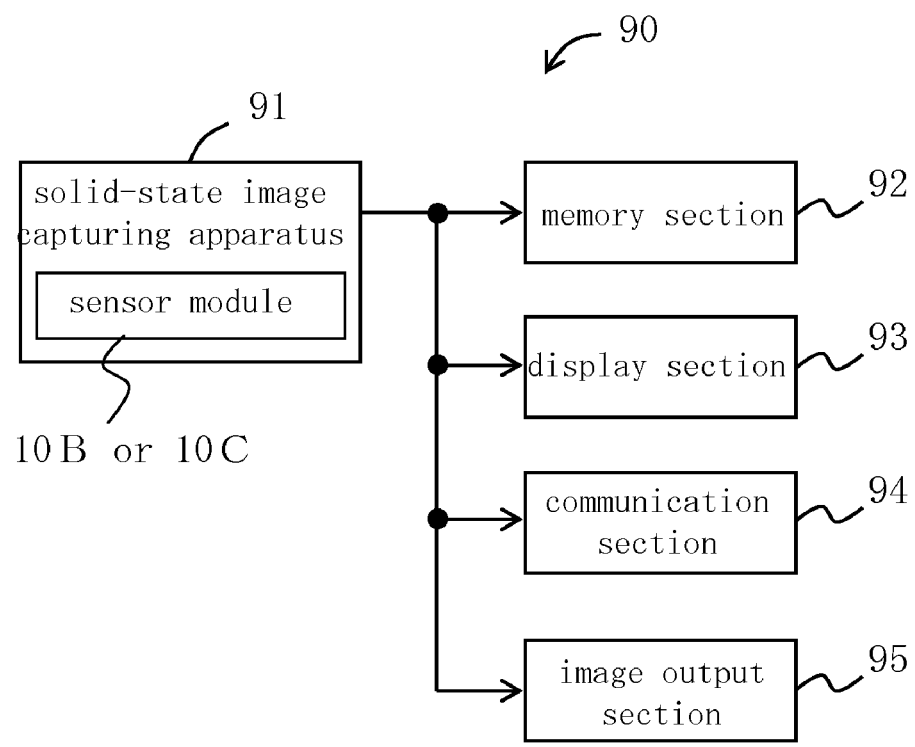
FIG. 8 is a block diagram schematically illustrating an exemplary configuration of an electronic information device of Embodiment 3 of the present invention, including a solid-state image capturing apparatus including a sensor module according to Embodiment 1 of the present invention, or a sensor module including the lens and lens module according to Embodiment 2 of the present invention, used in an image capturing section thereof.
Figure 9:
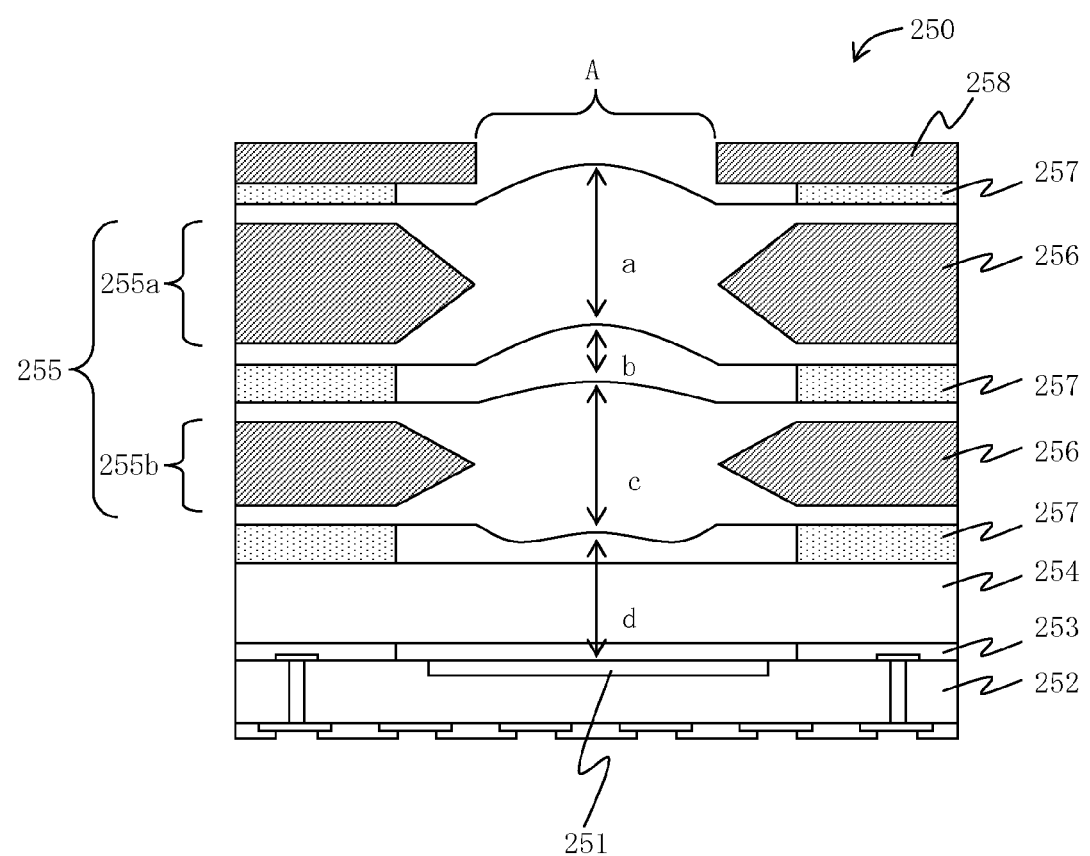
FIG. 9 is an essential part longitudinal cross sectional view illustrating an image capturing element wafer module in which a plurality of lens wafers disclosed in Reference 1 are used with lenses provided in a plurality of through holes of a lens substrate and the lens wafers are modularized with an image capturing element wafer.
Figure 10:
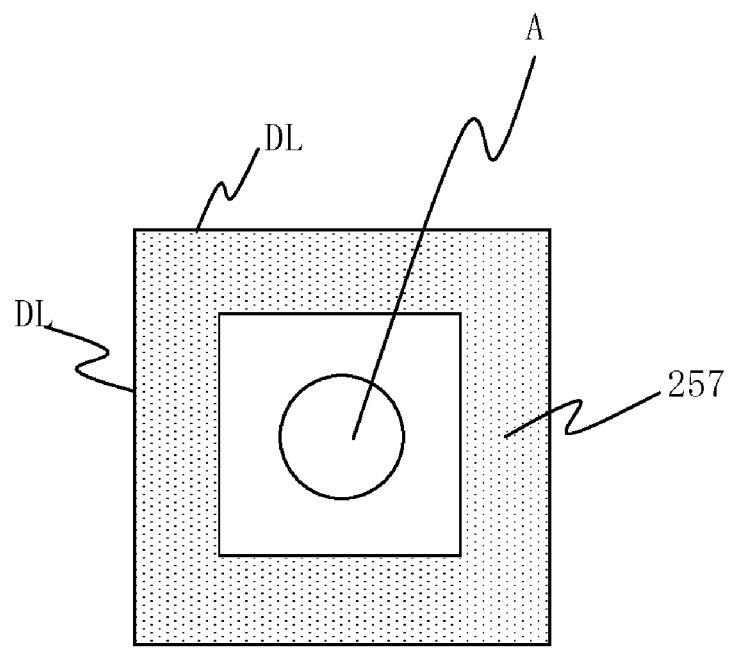
FIG. 10 is an arrangement plan of an adhesive, viewing the image capturing element wafer module of FIG. 9 from the top.

FIG. 8 is a block diagram schematically illustrating an exemplary configuration of an electronic information device of Embodiment 3 of the present invention, including a solid-state image capturing apparatus including the sensor module 10B according to Embodiment 1 of the present invention, or the sensor module 10C including the lens and lens module according to Embodiment 2 of the present invention, used in an image capturing section thereof.

In FIG. 8, an electronic information device 90 according to Embodiment 3 of the present invention includes: a solid-state image capturing apparatus 91 for performing various signal processing on an image capturing signal from the sensor module 10B according to Embodiment 1 of the present invention, or the sensor module 10C including the lens and lens module according to Embodiment 2 of the present invention, so as to obtain a color image signal; a memory section 92 (e.g., recording media) for data-recording a color image signal from the solid-state image capturing apparatus 91 after a predetermined signal processing is performed on the color image signal for recording; a display section 93 (e.g., a liquid crystal display apparatus) for displaying the color image signal from the solid-state image capturing apparatus 91 on a display screen (e.g., liquid crystal display screen) after predetermined signal processing is performed on the color image signal for display; a communication section 94 (e.g., a transmitting and receiving device) for communicating the color image signal from the solid-state image capturing apparatus 91 after predetermined signal processing is performed on the color image signal for communication; and an image output section 95 (e.g., a printer) for printing the color image signal from the solid-state image capturing apparatus 91 after predetermined signal processing is performed for printing. Without any limitations to this, the electronic information device 90 may include any of the memory section 92, the display section 93, the communication section 94, and the image output section 95, such as a printer, other than the solid-state image capturing apparatus 91.

As the electronic information device 90, an electronic information device that includes an image input device is conceivable, such as a digital camera (e.g., digital video camera or digital still camera), an image input camera (e.g., a monitoring camera, a door phone camera, a camera equipped in a vehicle such as a car-mounted back view camera, or a television camera), a scanner, a facsimile machine, a television telephone device, a camera-equipped cell phone device, or a personal digital assistance (PDA).

Therefore, according to Embodiment 3 of the present invention, the color image signal from the solid-state image capturing apparatus 91 can be: displayed on a display screen properly by the display section 93, printed out on a sheet of paper using an image output section 95, communicated properly as communication data via a wire or a radio by the communication section 94, stored properly at the memory section 92 by performing predetermined data compression processing; and various data processes can be properly performed.

Without the limitation to the electronic information device 90 according to Embodiment 3 described above, an electronic information device, such as a pick up apparatus including the electronic element module according to the present invention used in an information recording and reproducing section thereof, is also conceived. An optical element of the pick up apparatus in this case is an optical function element (hologram optical element, for example) that directs output light straight to be output and refracting and guiding incident light in a predetermined direction. In addition, as the electronic element of the pick up apparatus, a light emitting element (semiconductor laser element or laser chip, for example) for emitting output light and a light receiving element (photo IC, for example) for receiving incident light are included.

Although not specifically described in detail in Embodiment 1, the optical element support plate, which is provided inside the transparent resin material configuring the plurality of optical elements, has light shielding characteristics. The side of the outer circumference portion of the through hole of the optical element support plate is provided inside the spacer section. The side of the outer circumference portion of the through hole is formed thicker than the further side of the outer circumference portion thereof. As a result of the above structures, after the manufacturing of the module, the objective of the present invention, the further shielding of light in the transverse direction, can be achieved.

As described above, the present invention is exemplified by the use of its preferred Embodiments 1 to 3. However, the present invention should not be interpreted solely based on Embodiments 1 to 3 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 3 of the present invention. Furthermore, it is understood that any patent, any patent application and any references cited in the present specification should be incorporated by reference in the present specification in the same manner as the contents are specifically described therein.

Industrial Applicability

The present invention can be applied in the field of an optical element provided with a lens and an optical function element; an optical element module, such as a plurality of lenses and a plurality of optical function elements; an optical element wafer provided with a plurality of optical elements, such as a plurality of lenses and a plurality of optical function elements, in a wafer state; an optical element wafer module in which the plurality of optical element wafers are laminated; a method for manufacturing the optical element module by cutting the optical element wafer or the optical element wafer module; an electronic element wafer module in which the optical element wafer or optical element wafer module is modularized with an electronic element wafer; a method for manufacturing an electronic element module, in which the electronic element wafer module is cut simultaneously into electronic element modules; an electronic element module manufactured by the method for manufacturing the electronic element module; an electronic information device, such as a digital camera (e.g., a digital video camera or a digital still camera), an image input camera, a scanner, a facsimile machine, a camera-equipped cell phone device or a television telephone device, including the electronic element module used therein. According to the present invention, the surface height of the spacer section provided on the outer circumference side of the optical element area is configured to be higher than the surface height of the optical element area in the center portion. Therefore, in the manufacturing process, the optical element support plate including one or a plurality of the through holes penetrating only the optical element area is disposed inside the transparent resin material, which constitutes the plurality of optical elements. The optical element support plate has light shielding characteristics, the outer circumference side of the through hole of the optical element support plate is located inside the spacer section, and the outer circumference side of the through hole for a lens is formed thicker than the further outer circumference side thereof. As a result, it becomes possible to dispose the adhesive in the gap on the further side of the outer circumference portion by laminating the wafers on top of another when manufacturing the module, and therefore, the light enters only through the thickness of the transparent lens resin in the transverse direction without the adhesive after the manufacturing of the module, thereby further shielding the light.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:
1. An optical element, comprising:
   an optical surface at a center portion thereof;
   a spacer section having a predetermined thickness on an outer circumference side of the optical surface;
   a support plate including one or a plurality of through holes penetrating a portion corresponding to the optical surface, provided inside a transparent resin material, the transparent material forming the optical surface and the spacer section, wherein the support plate has light shielding characteristics, an outer circumference portion side of the through hole of the support plate is provided inside the spacer section, and the outer circumference portion side of the through hole is configured to be thicker than a further outer circumference portion side thereof located against a side wall of the optical element.

2. An optical element according to claim 1, wherein the outer circumference portion and the further outer circumference portion of the through hole of the support plate are connected to each other with a light-shielding tapered surface for the optical surface interposed therebetween.

3. An optical element according to claim 1, wherein an inner circumference surface of the through hole of the support substrate is configured as an inclined surface, and a through hole and/or a concave portion for releasing a resin material when forming resin is further provided at the further outer circumference portion.

4. An optical element according to claim 1, wherein a surface height of the spacer section is configured to be higher than a surface height of the optical surface, and the spacer section and the optical surface are connected to each other with an inclined surface interposed therebetween.

5. An optical element according to claim 4, wherein the spacer section is a protruded portion or a planarized portion, which is further protruded than a convex shape of the optical surface, surrounding the optical surface area from the outer circumference portion of the optical surface with the inclined surface interposed therebetween.

6. An optical element according to claim 5, wherein the protruded portion is annularly protruded, or is protruded as part of the annular shape, further than the convex shape of the optical surface, from the outer circumference side of the optical surface with the inclined surface interposed therebetween.

7. An optical element according to claim 6, wherein a part or all of a top surface of the annular protruded portion includes a planarized surface.

8. An optical element according to claim 4, wherein when a securing tape is adhered on the spacer section to cover an upper part thereof during individual cutting, the surface height of the spacer section is configured to be higher than the surface height of the optical surface so that the securing tape does not adhere on the optical surface of the optical element.

9. An optical element according to claim 4, wherein the optical surface and the protruded portion or the planarized portion, which is more protruded than the optical surface, are provided on either a front surface or a back surface of the optical element.

10. An optical element according to claim 4, wherein a difference between the surface height of the spacer section and the surface height of the optical surface is within 20 μm to 100 μm.

11. An optical element according to claim 4, wherein a difference between the surface height of the spacer section and the surface height of the optical surface is 50 μm plus or minus 10 μm.

12. An optical element according to claim 4, wherein the optical surface and the spacer section are simultaneously formed with a transparent resin material.

13. An optical element according to claim 1, wherein the spacer section is provided for the optical surface.

14. An optical element according to claim 13, wherein a difference between the surface height of the spacer section and the surface height of the optical surface is 50 μm plus or minus 10 μm.

15. An optical element according to claim 1, wherein the optical element is a lens.

16. An optical element according to claim 1, wherein the optical element is an optical function element for directing output light straight to be output and refracting and guiding incident light in a predetermined direction.

17. An optical element according to claim 1, wherein the optical surface is a circle with a diameter of 1 mm plus or minus 0.5 mm.

18. An optical element according to claim 1, wherein a bottom portion for positioning an adhesive material is provided on a further outer circumference side of the spacer section with a step portion interposed therebetween.

19. An optical element module, in which a plurality of optical elements according to claim 1 are laminated, wherein of an upper most optical element and a lower most optical element, a height of a surface of a spacer section of at least either optical element is higher than a height of a surface of an optical surface of the respective optical element.

20. An optical element module according to claim 19, wherein among the plurality of the optical elements, a lens space between the upper optical element and the lower optical element is controlled by a planarized surface of the spacer section of the upper optical element and a planarized surface of the spacer section of the lower optical element in direct contact with each other.

21. An optical element module according to claim 20, wherein an adhesive is positioned in a space portion surrounded by a bottom portion on a further outer circumference side of each of the planarized surfaces of the spacer section of the upper optical element and the spacer section of the lower optical element, so that the upper optical element and the lower optical element are adhered to each other.

22. An optical element module according to claim 21, wherein the space portion of the bottom portion is a sufficient space for the adhesive to be put between and be spread by bottom portions of the upper and lower optical elements when adhering.

23. An optical element module according to claim 21, wherein the adhesive is provided on an outside of the optical surface and an inside of a quadrilateral along dicing lines at a predetermined width, and a vent is provided at a corner portion and/or a side portion of the quadrilateral adhesive.

24. An optical element module according to claim 21, wherein an adhesive for capturing dust is further provided on an outside of the optical surface and an inside of the quadrilateral along dicing lines at a predetermined width, the adhesive being cohesive even after a curing of the resin.

25. An optical element module according to claim 24, wherein a part or all of the adhesive for capturing dust is provided facing the vent inside the quadrilateral adhesive.

26. An optical element module according to claim 21, wherein the adhesive has light shielding characteristics.

27. An optical element module according to claim 19, wherein of an upper surface, except for the optical surface, and a side surface of the plurality of optical elements, the optical element module further includes, a light shielding holder for shielding at least the upper surface.

28. An optical element module, wherein of an upper surface, except for the optical surface, and a side surface of an optical element according to claim 1, the optical element module further includes a light shielding holder for shielding at least the upper surface.

29. An optical element wafer in which a plurality of optical elements according to claim 1 are simultaneously formed and arranged in two dimensions.

30. An optical element wafer module in which a plurality of optical element wafers according to claim 29 are laminated by aligning the optical surfaces thereof.

31. An optical element wafer module in which a plurality of optical element modules according to claim 19 are arranged in two dimensions.

32. A method for manufacturing an optical element module, the method comprising:
a step of adhering a securing tape to at least either of a front surface side or a back surface side of an optical element wafer according to claim 29; and
a cutting step of simultaneously cutting the optical element wafer or the optical element wafer module along dicing lines to be individualized.

33. A method for manufacturing an optical element module,
the method comprising:
a step of adhering a securing tape to at least either of a front surface side or a back surface side of an optical element wafer module according to claim 31; and
a cutting step of simultaneously cutting the optical element wafer module along dicing lines to be individualized.

34. An electronic element wafer module, comprising:
an electronic element wafer in which a plurality of electronic elements are arranged;
a resin adhesion layer formed in a predetermined area on the electronic element wafer;
a transparent support substrate covering the electronic element wafer and fixed on the resin adhesion layer; and
an optical element wafer according to claim 29, which is adhered on the transparent support substrate so that each optical element corresponds to each of the plurality of electronic elements.

35. An electronic element wafer module according to claim 34, wherein a space between the lower most optical element wafer and the electronic element is controlled by a planarized surface of a spacer section of the lower most optical element wafer and a planarized surface of the transparent support substrate in direct contact with each other.

36. An electronic element wafer module according to claim 34, wherein an adhesive is positioned in a space portion surrounded by a bottom portion on a further outer circumference side of a planarized surface of the spacer section of the lower most optical element wafer and the transparent support substrate, so that the lower most optical element wafer and the transparent support substrate are adhered to each other.

37. An electronic element wafer module according to claim 36, wherein the space portion by the bottom portion is a sufficient space for the adhesive to be put between and be spread from a top and bottom when adhering.

38. An electronic element wafer module according to claim 34, wherein the electronic element is an image capturing element including a plurality of light receiving sections for performing an electronic conversion on and capturing an image of image light from a subject.

39. An electronic element wafer module according to claim 34, wherein the electronic element is a light emitting element for outputting output light and a light receiving element for receiving incident light.

40. An electronic element wafer module, comprising:
an electronic element wafer in which a plurality of electronic elements are arranged;
a resin adhesion layer formed in a predetermined area on the electronic element wafer;
a transparent support substrate covering the electronic element wafer and fixed on the resin adhesion layer; and
an optical element wafer module according to claim 31, which is adhered on the transparent support substrate so that each optical element corresponds to each of the plurality of electronic elements.

41. An electronic element wafer module according to claim 40,
wherein a space between the lower most optical element wafer and the electronic element is controlled by a planarized surface of a spacer section of the lower most optical element wafer and a planarized surface of the transparent support substrate in direct contact with each other.

42. An electronic element wafer module according to claim 40,
wherein an adhesive is positioned in a space portion surrounded by a bottom portion on a further outer circumference side of a planarized surface of the spacer section of the lower most optical element wafer and the transparent support substrate, so that the lower most optical element wafer and the transparent support substrate are adhered to each other.

43. An electronic element wafer module according to claim 42, wherein the space portion by the bottom portion is a sufficient space for the adhesive to be put between and be spread from a top and bottom when adhering.

44. An electronic element wafer module according to claim 35, wherein the electronic element is an image capturing element including a plurality of light receiving sections for performing an electronic conversion on and capturing an image of image light from a subject.

45. An electronic element wafer module according to claim 35, wherein the electronic element is a light emitting element for outputting output light and a light receiving element for receiving incident light.

46. A method for manufacturing an electronic element module,
the method comprising:
a step of adhering a securing tape to a front surface side of the optical elements of an electronic element wafer module according to claim 34; and
a cutting step of simultaneously cutting the electronic element wafer module from the electronic element wafer side along dicing lines to be individualized 47. A method for manufacturing an electronic element module, the method comprising:
a step of adhering a securing tape to a front surface side of an optical element wafer module of an electronic element wafer module according to claim 40; and
a cutting step of simultaneously cutting the electronic element wafer module from the electronic element wafer side along dicing lines to be individualized.

48. A method for manufacturing an electronic element module, the method comprising:
an image capturing element wafer unit forming step of adhering and fixing a transparent support substrate by a resin adhesion layer in such a manner to cover an electronic element wafer, in which a plurality of electronic elements are arranged, to form an image capturing element wafer unit;
a cutting step of simultaneously cutting the image capturing element wafer unit from the electronic element wafer side along dicing lines to be individualized into image capturing element units; and
a step of adhering the optical element module manufactured by the method for manufacturing an optical element module according to claim 32 to an image capturing element unit in such a manner that the image capturing element corresponds to the optical element.

49. A method for manufacturing an electronic element module, the method comprising:
- an image capturing element wafer unit forming step of adhering and fixing a transparent support substrate by a resin adhesion layer in such a manner to cover an electronic element wafer, in which a plurality of electronic elements are arranged, to form an image capturing element wafer unit;
- a cutting step of simultaneously cutting the image capturing element wafer unit from the electronic element wafer side along dicing lines to be individualized into image capturing element units; and
- a step of adhering an optical element module manufactured by the method for manufacturing an optical element module according to claim 33 to the image capturing element unit in such a manner that the image capturing element corresponds to the optical element.

50. An electronic element module, which is cut from an electronic element wafer module according to claim 34.

51. An electronic element module, which is cut from an electronic element wafer module according to claim 40.

52. An electronic information device including an electronic element module individualized by cutting an electronic element wafer module according to claim 38, as a sensor module used in an image capturing section.

53. An electronic information device including an electronic element module individualized by cutting an electronic element wafer module according to claim 44, as a sensor module used in an image capturing section.

54. An electronic information device including an electronic element module individualized by cutting an electronic element wafer module according to claim 39, used in an information recording and reproducing section.

55. An electronic information device including an electronic element module individualized by cutting an electronic element wafer module according to claim 45, used in an information recording and reproducing section.

56. An electronic information device including an electronic element module manufactured by the method for manufacturing an electronic element module according to claim 48.

57. An electronic information device including an electronic element module manufactured by the method for manufacturing an electronic element module according to claim 49.

* * * * *